(12) United States Patent
Makabe (10) Patent No.: US 11,164,856 B2
(45) Date of Patent: Nov. 2, 2021

(54) TSV CHECK CIRCUIT WITH REPLICA PATH

(71) Applicant: MICRON TECHNOLOGY, INC., Boise, ID (US)

(72) Inventor: Harutaka Makabe, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 53 days.

(21) Appl. No.: 16/576,647

(22) Filed: Sep. 19, 2019

(65) Prior Publication Data

US 2021/0091058 A1    Mar. 25, 2021

(51) Int. Cl.
| | |
|---|---|
| *H01L 25/18* | (2006.01) |
| *H01L 25/065* | (2006.01) |
| *G11C 7/12* | (2006.01) |
| *G11C 8/08* | (2006.01) |
| *G11C 5/02* | (2006.01) |
| *H01L 23/48* | (2006.01) |
| *G11C 7/22* | (2006.01) |
| *G11C 29/50* | (2006.01) |
| *H01L 23/00* | (2006.01) |

(52) U.S. Cl.
CPC ............... *H01L 25/18* (2013.01); *G11C 5/02* (2013.01); *G11C 7/12* (2013.01); *G11C 7/227* (2013.01); *G11C 8/08* (2013.01); *G11C 29/50012* (2013.01); *H01L 23/481* (2013.01); *H01L 25/0657* (2013.01); *H01L 24/16* (2013.01); *H01L 24/17* (2013.01); *H01L 2224/16147* (2013.01); *H01L 2224/16148* (2013.01); *H01L 2224/16227* (2013.01); *H01L 2224/16238* (2013.01); *H01L 2224/17181* (2013.01); *H01L 2225/06513* (2013.01); *H01L 2225/06517* (2013.01); *H01L 2225/06541* (2013.01); *H01L 2225/06565* (2013.01)

(58) Field of Classification Search
CPC ... H01L 25/18; H01L 25/0657; H01L 25/481; H01L 2225/06541; H01K 2225/06565; G11C 5/02; G11C 7/12; G11C 7/227; G11C 8/08
USPC ............. 365/51, 204, 201, 200, 210, 230.08
See application file for complete search history.

(56) References Cited

U.S. PATENT DOCUMENTS

| | | |
|---|---|---|
| 9,401,312 B1 | 7/2016 | Kannan et al. |
| 10,916,489 B1 | 2/2021 | Nishioka et al. |
| 10,930,363 B1 | 2/2021 | Nishioka |

(Continued)

OTHER PUBLICATIONS

PCT Patent Application PCT/US20/52007 titled "TSV Auto Repair Scheme on Stacked Die" filed Sep. 22, 2020.

(Continued)

*Primary Examiner* — Connie C Yoha
(74) *Attorney, Agent, or Firm* — Dorsey & Whitney LLP (57) ABSTRACT

Disclosed herein is an apparatus that includes a first semiconductor chip, first and second TSVs penetrating the first semiconductor chip, a first path including the first TSV, a second path including the second TSV, a first charge circuit configured to charge the first path, a second charge circuit configured to charge the second path, a first discharge circuit configured to discharge the first path, a second discharge circuit configured to discharge the second path, and a comparator circuit configured to compare a potential of the first path with a potential of the second path.

20 Claims, 10 Drawing Sheets

(56) References Cited

U.S. PATENT DOCUMENTS

| | | |
|---|---|---|
| 2009/0135638 A1 | 5/2009 | Shimizu |
| 2010/0295600 A1* | 11/2010 | Kim ................... H01L 25/0657 327/365 |
| 2012/0069685 A1 | 3/2012 | Ide et al. |
| 2012/0105093 A1 | 5/2012 | Lee |
| 2012/0106229 A1 | 5/2012 | Kondo |
| 2012/0114086 A1 | 5/2012 | Hayashi |
| 2013/0082404 A1 | 4/2013 | Kajigaya et al. |
| 2013/0230932 A1 | 9/2013 | Bringivijayaraghavan et al. |
| 2015/0206825 A1 | 7/2015 | Park |
| 2015/0262648 A1 | 9/2015 | Nishioka et al. |
| 2015/0363258 A1 | 12/2015 | Shin et al. |
| 2016/0064357 A1* | 3/2016 | Choe ..................... H01L 23/481 257/774 |
| 2017/0110169 A1 | 4/2017 | Kim et al. |
| 2017/0110206 A1 | 4/2017 | Ryu et al. |
| 2017/0154655 A1 | 6/2017 | Seo |
| 2017/0227605 A1* | 8/2017 | Kim ................. G01R 31/31723 |
| 2017/0301667 A1 | 10/2017 | Or-bach et al. |
| 2018/0122686 A1 | 5/2018 | Or-bach et al. |
| 2018/0247876 A1 | 8/2018 | Kim et al. |
| 2018/0277216 A1 | 9/2018 | Inoue et al. |
| 2019/0067359 A1 | 2/2019 | Matsumoto |
| 2019/0096776 A1* | 3/2019 | Nishioka ............ G01R 31/2884 |
| 2019/0362804 A1 | 11/2019 | Kim |
| 2020/0027521 A1 | 1/2020 | Choi |

OTHER PUBLICATIONS

Chou, Yung-Fa et al., "Reactivation of Spares for Off-Chip Memory Repair After Die Stacking in a 3-D IC With TSVs", IEEE Transactions on Circuits and Systems I: Regular Papers, vol. 60, No. 9, Sep. 2013, pp. 2343-2351.

Lee, Changwook et al., "A New Fuse Architecture and a New Post-Share Redundancy Scheme for Yield Enhancement in 3-D Stacked Memories", IEEE Transactions on Computer-Aided Design of Integrated Circuits and Systems, vol. 33, No. 5, May 2014, pp. 786-797.

U.S. Appl. No. 16/590,760 titled "Memory Core Chip Having TSVs" filed Oct. 2, 2019.

U.S. Appl. No. 16/590,789 titled "TSV Auto Repair Scheme on Stacked Die" filed Oct. 2, 2019.

U.S. Appl. No. 17/173,064 titled "TSV Auto Repair Scheme on Stacked Die" filed Feb. 10, 2021.

U.S. Appl. No. 17/164,454, titled "Memory Core Chip Having TSVs", dated Feb. 1, 2021.

* cited by examiner

TSV CHECK CIRCUIT WITH REPLICA PATH

BACKGROUND

A semiconductor chip used in a memory device such as an HBM (High Bandwidth Memory) includes a number of TSVs (Through Silicon Vias) each provided to penetrate through a semiconductor substrate in some cases. A TSV provided in each semiconductor chip is connected to a TSV provided at the same plane position in another semiconductor chip via a microbump, so that a signal path that penetrates through a plurality of semiconductor substrates is formed. If a certain TSV has a conduction failure or a connecting portion between two TSVs has a connection failure, the corresponding signal path becomes defective and cannot be used actually. In this case, a spare signal path is used in place of the signal path with the failure, so that the failure is recovered. Inspection of each signal path and replacement with a spare signal path may be performed not only in a manufacturing stage but also in actual use, i.e., an initialization period after a power is turned on. In a case where inspection of signal paths is performed in the initialization period, an inspection time that can be assigned to each signal path is very short. Therefore, it is not easy to perform correct inspection for all the signal paths.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
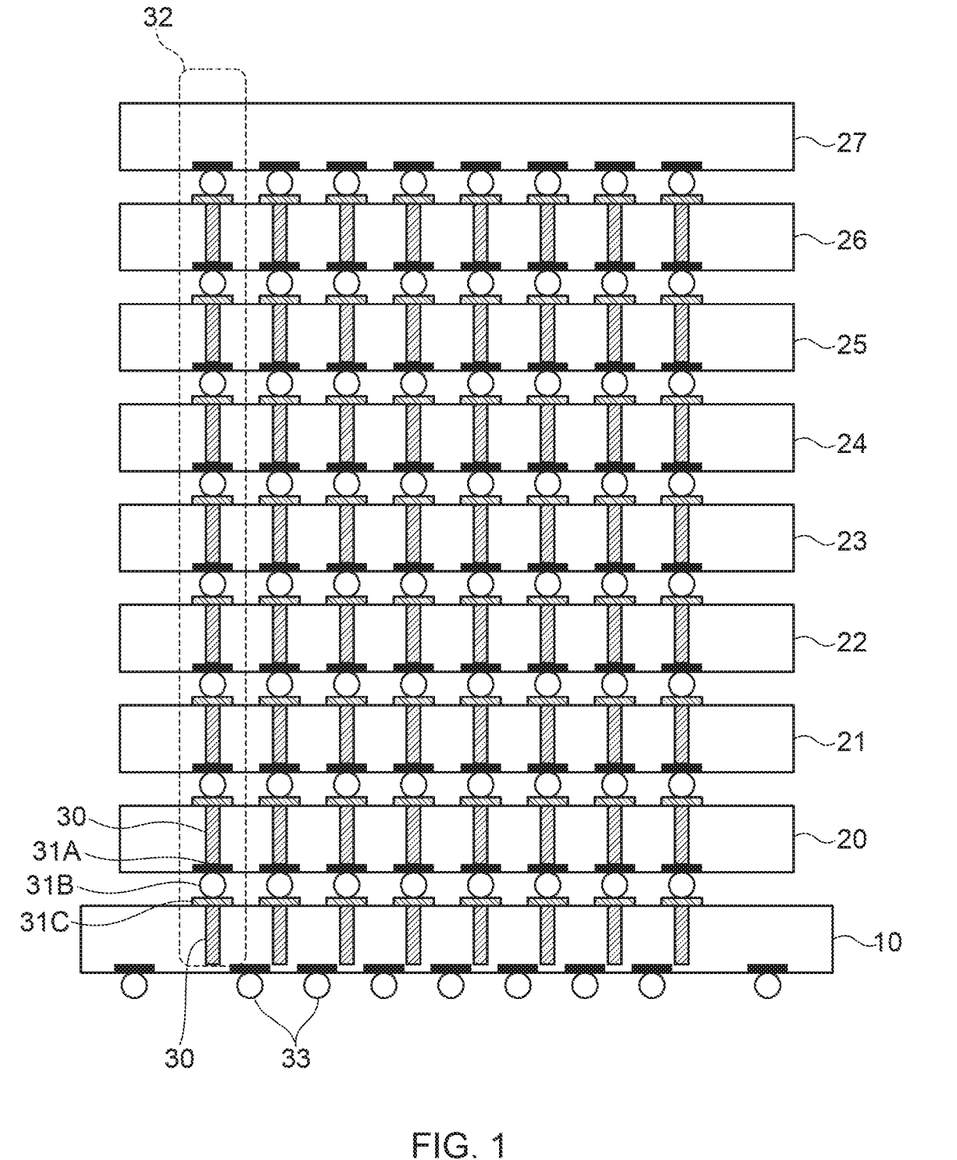
FIG. 1 is a schematic diagram showing a configuration of a semiconductor device according to the present disclosure.

A semiconductor device shown in FIG. 1 is an HBM having a configuration in which eight memory core chips 20 to 27 are stacked on an interface chip 10. However, the semiconductor device to which the present invention is applicable is not limited to an HBM. The memory core chips 20 to 27 are each a semiconductor chip in which a memory core including a memory cell array is integrated. The interface chip 10 is a semiconductor chip that controls the memory core chips 20 to 27. The interface chip 10 and the memory core chips 20 to 26 each have a plurality of TSVs 30 that are provided to penetrate through a semiconductor substrate. All the interface chip 10 and the memory core chips 20 to 27 are stacked in a face-down manner, that is, in such a manner that a main surface with transistors and a wiring pattern (both not shown) formed thereon faces down. Therefore, no TSV 30 is required in the memory core chip 27 located in an uppermost layer. However, the memory core chip 27 located in the uppermost layer may have the TSV 30. Almost all the TSVs 30 provided in the memory core chips 20 to 26 are connected to front-surface TSV pads 31A located at the same plane positions, respectively. Meanwhile, most of the TSVs 30 provided in the interface chip 10 and most of the front-surface TSV pads 31A provided on the interface chip 10 are present at different plane positions from each other. Among the TSVs 30 provided in the interface chip 10 and the memory core chips 20 to 26, the TSVs 30 located at the same plane position are connected to each other in cascade connection via the front-surface TSV pad 31A, a TSV bump 31B, and a rear-surface TSV pad 31C. In this manner, a plurality of signal paths 32 are formed. A command and write data output from the interface chip 10 are supplied to the memory core chips 20 to 27 via the signal paths 32. Read data output from the memory core chips 20 to 27 is supplied to the interface chip 10 via the signal paths 32. External terminals 33 are provided on the interface chip 10, via which signal transmission and reception to/from an external circuit are performed.

Figure 2:
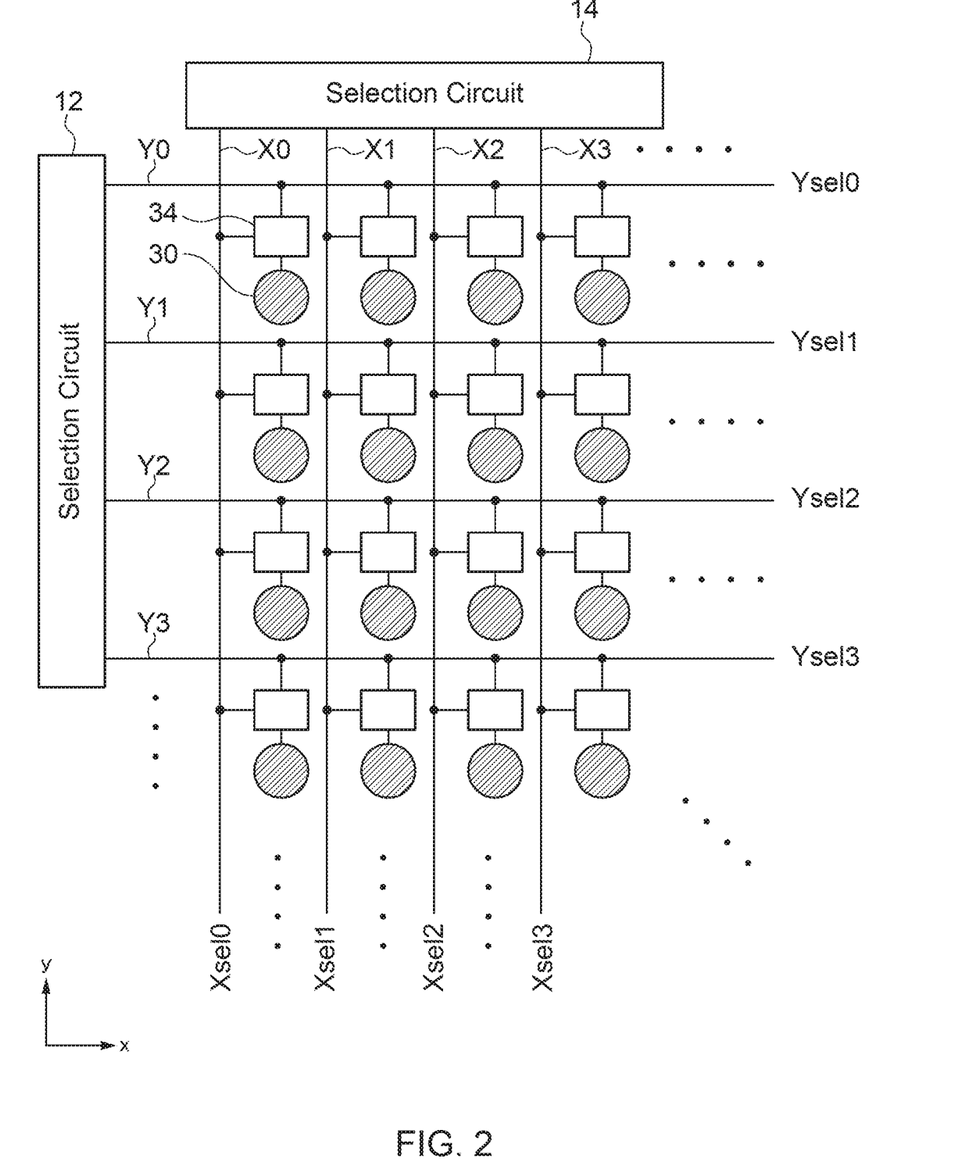
FIG. 2 is a schematic plan view showing a layout of a plurality of TSVs.

As shown in FIG. 2, the TSVs 30 are arranged in a matrix form in each of the interface chip 10 and the memory core chips 20 to 26. A selection circuit 34 is assigned to each TSV 30. The selection circuits 34 are used in inspection of the signal paths 32 performed in a manufacturing stage and an initialization period after a power is turned on. As shown in FIG. 2, to the TSVs 30 arranged in an x-direction, a corresponding one of selection-signal lines Y0, Y1, Y2, Y3, . . . is assigned. To the TSVs 30 arranged in a y-direction, a corresponding one of selection-signal lines X0, X1, X2, X3, . . . is assigned. The selection-signal lines Y0, Y1, Y2, Y3 . . . supply selection signals Ysel0, Ysel1, Ysel2, Ysel3, . . . to the corresponding selection circuits 34, respectively. The selection-signal lines X0, X1, X2, X3, . . . supply selection signals Xsel0, Xsel1, Xsel2, Xsel3, . . . to the corresponding selection circuits 34, respectively. A selection circuit 12 activates any one of the selection signals Ysel0, Ysel1, Ysel2, Ysel3, . . . and deactivates all the remaining signals. A selection circuit 14 activates any one of the selection signals Xsel0, Xsel1, Xsel2, Xsel3, . . . and deactivates all the remaining signals. In this manner, any one of the selection circuits 34 is activated, so that one of the TSVs 30 corresponding thereto is selected.

Figure 3:
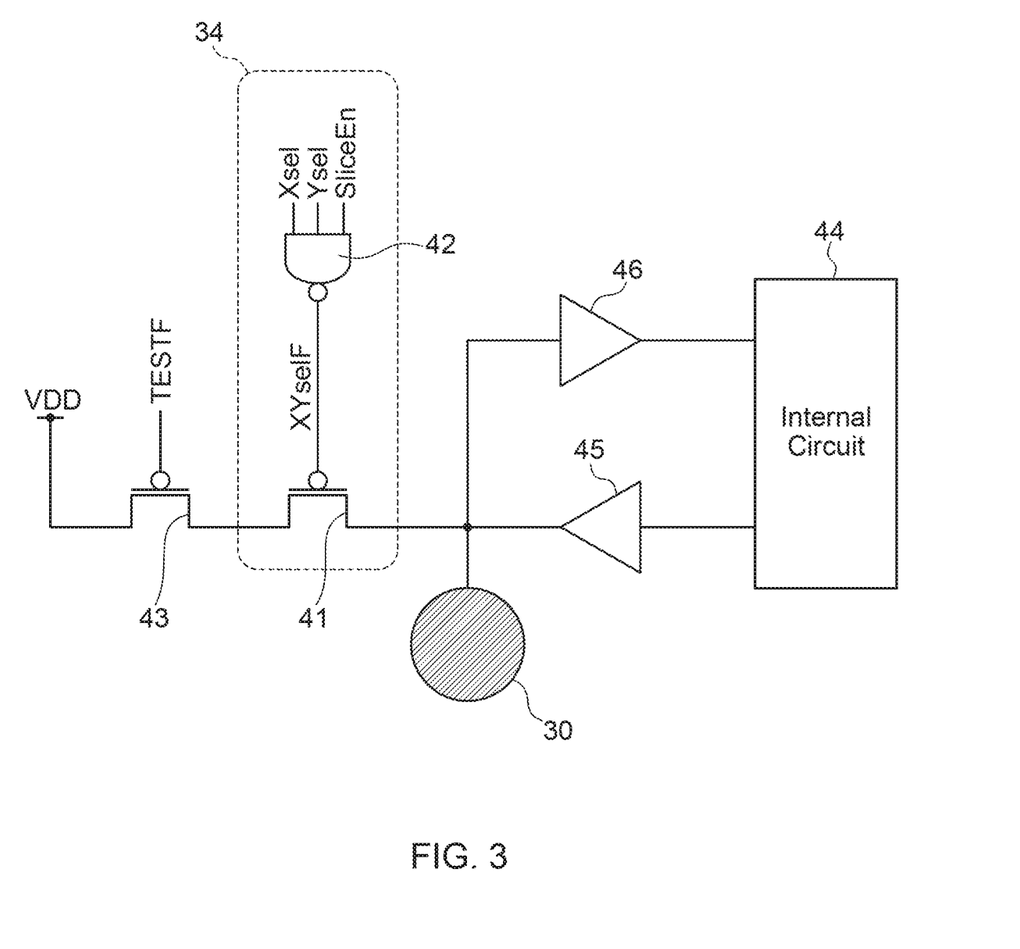
FIG. 3 is a circuit diagram showing a circuit connected to the TSV in a memory core chip.

Each selection circuit 34 included in each of the memory chips 20 to 27 includes a P-channel MOS transistor 41 and a NAND gate circuit 42 that controls the transistor 41, as shown in FIG. 3. The NAND gate circuit 42 receives a corresponding one of the selection signals Xsel0, Xsel1, Xsel2, Xsel3, . . . , a corresponding one of the selection signals Ysel0, Ysel1, Ysel2, Ysel3 . . . , and a selection signal SliceEn that selects one of the memory core chips 20 to 27 in which that NAND gate circuit 42 is included, and activates a selection signal XYselF to a low level when all the received signals are at an active level (a high level). In each of the memory core chips 20 to 27, a P-channel MOS transistor 43 and the P-channel MOS transistor 41 are connected in series between a power supply VDD and the TSV 30. A test signal TESTF is supplied to a gate electrode of the transistor 43. Therefore, when both the test signal TESTF and the selection signal XYselF are activated to a low level, the TSV 30 is connected to the power supply VDD. The power supply VDD is a high-potential side power supply for example. In this case, when both the test signal TESTF and the selection signal XYselF are activated, the signal path 32 is charged via the TSV 30.

Figure 4:
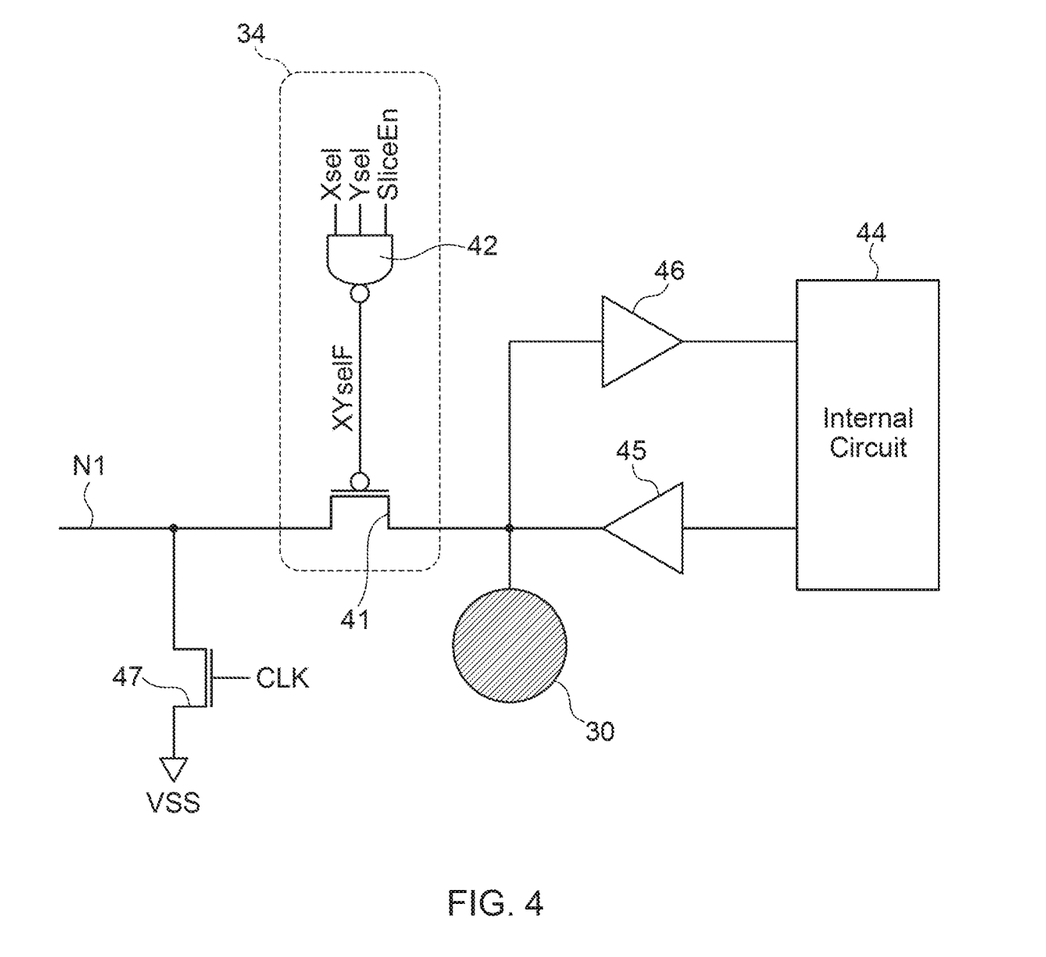
FIG. 4 is a circuit diagram showing a circuit connected to the TSV in an interface chip.

The selection circuit 34 included in the interface chip 10 has the same circuit configuration as the selection circuit 34 included in the memory core chips 20 to 27, as shown in FIG. 4. In the interface chip 10, the transistor 41 and an N-channel MOS transistor 47 are connected in series between the TSV 30 and a power supply VSS. A test clock signal CLK is supplied to a gate electrode of the transistor 47. Therefore, when the test clock signal CLK is activated to a high level and the selection signal XYselF is activated to a low level, the TSV 30 is connected to the power supply VSS. The power supply VSS is a low-potential side power supply, for example. In this case, when both the test clock signal CLK and the selection signal XYselF are activated, the signal path 32 is discharged via the TSV 30.

As shown in FIGS. 3 and 4, an output buffer 45 and an input receiver 46 are connected in parallel between an internal circuit 44 and the TSV 30 included in each of the interface chip 10 and the memory core chips 20 to 27. Therefore, data, a command, and the like output from the internal circuit 44 are supplied to the signal path 32 via the output buffer 45 and the TSV 30. Further, data, a command, and the like supplied from the signal path 32 are input to the internal circuit 44 via the TSV 30 and the input receiver 46.

Figure 5:
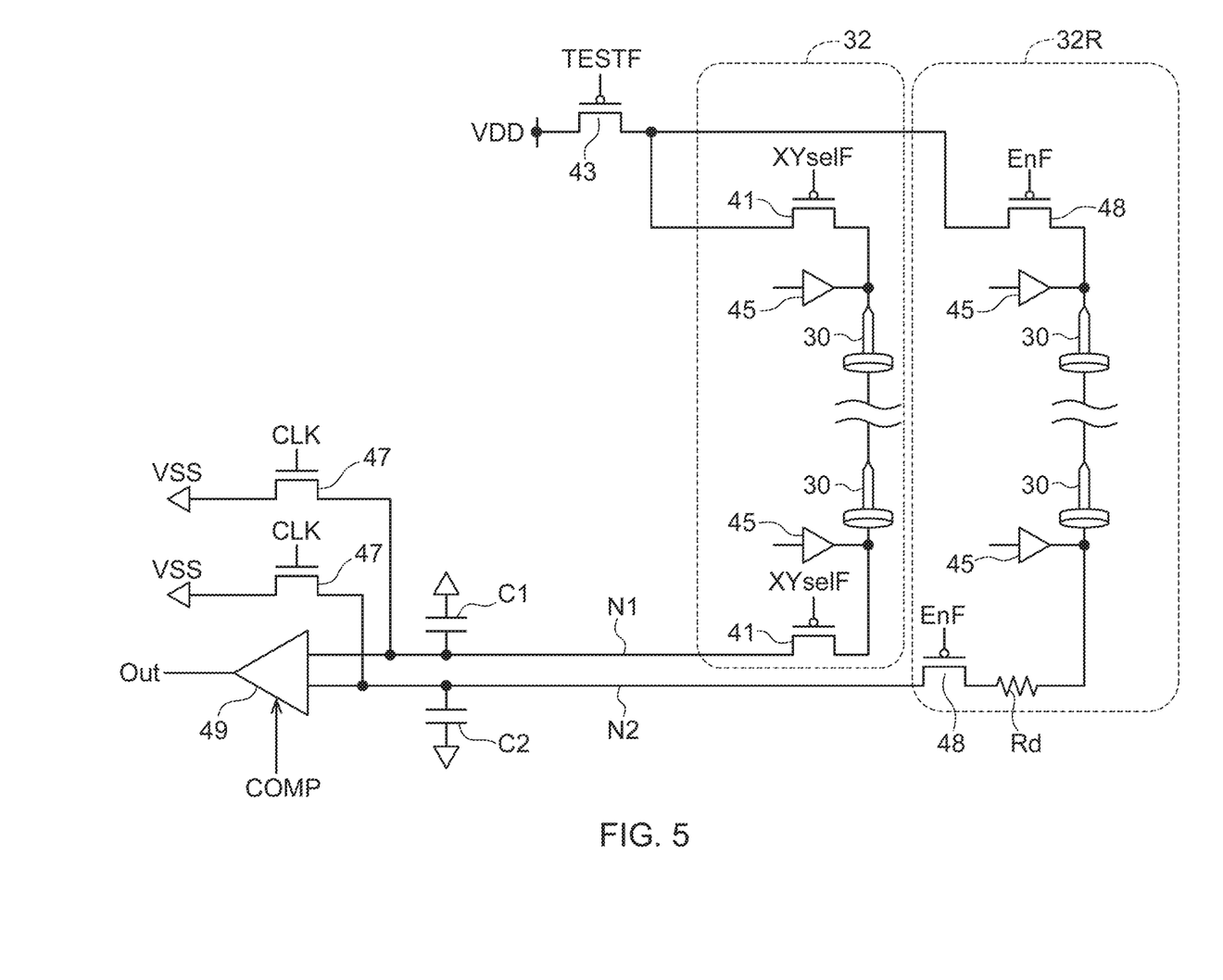
FIG. 5 is a circuit diagram showing a first circuit example in which a signal path is inspected.

As shown in FIG. 5, the plural signal paths 32 include a replica path 32R. The replica path 32R is used as a reference in inspection of the other signal paths 32 and has the same configuration as the signal paths 32 except that a transistor 48 for receiving an enable signal EnF is used in place of the transistor 41 and a dummy resistor Rd is inserted in series. The enable signal EnF is always activated during a test period. A parasitic capacitance C1 added to each signal path 32 and a parasitic capacitance C2 added to the replica path 32R are designed to have substantially the same values as each other. Each signal path 32 is connected to a node N1 via the transistor 41 provided on the interface chip 10, and the replica path 32R is connected to a node N2 via the transistor 48 provided on the interface chip 10. The interface chip 10 includes a comparator circuit 49 that compares a level at the node N1 and a level at the node N2 with each other in response to a comparison signal COMP.

Figure 6:
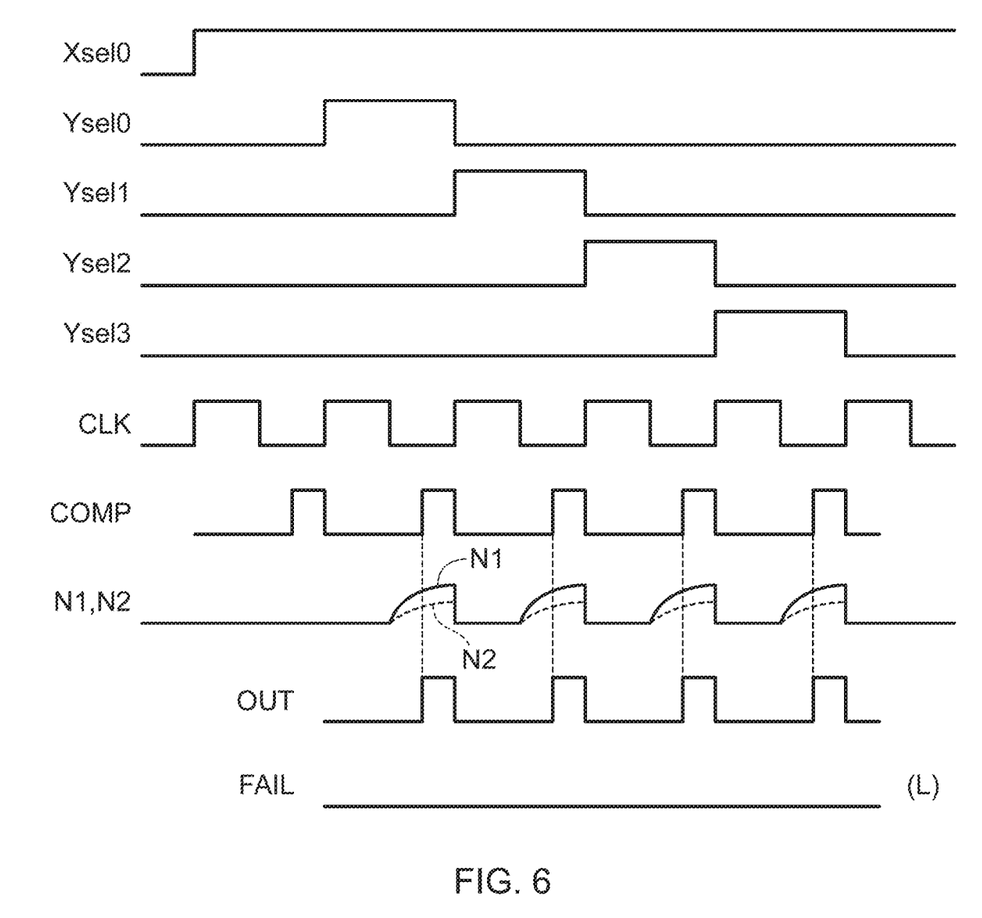
FIG. 6 and FIG. 7 are timing charts showing an operation of a circuit shown in FIG. 5.
Figure 7:
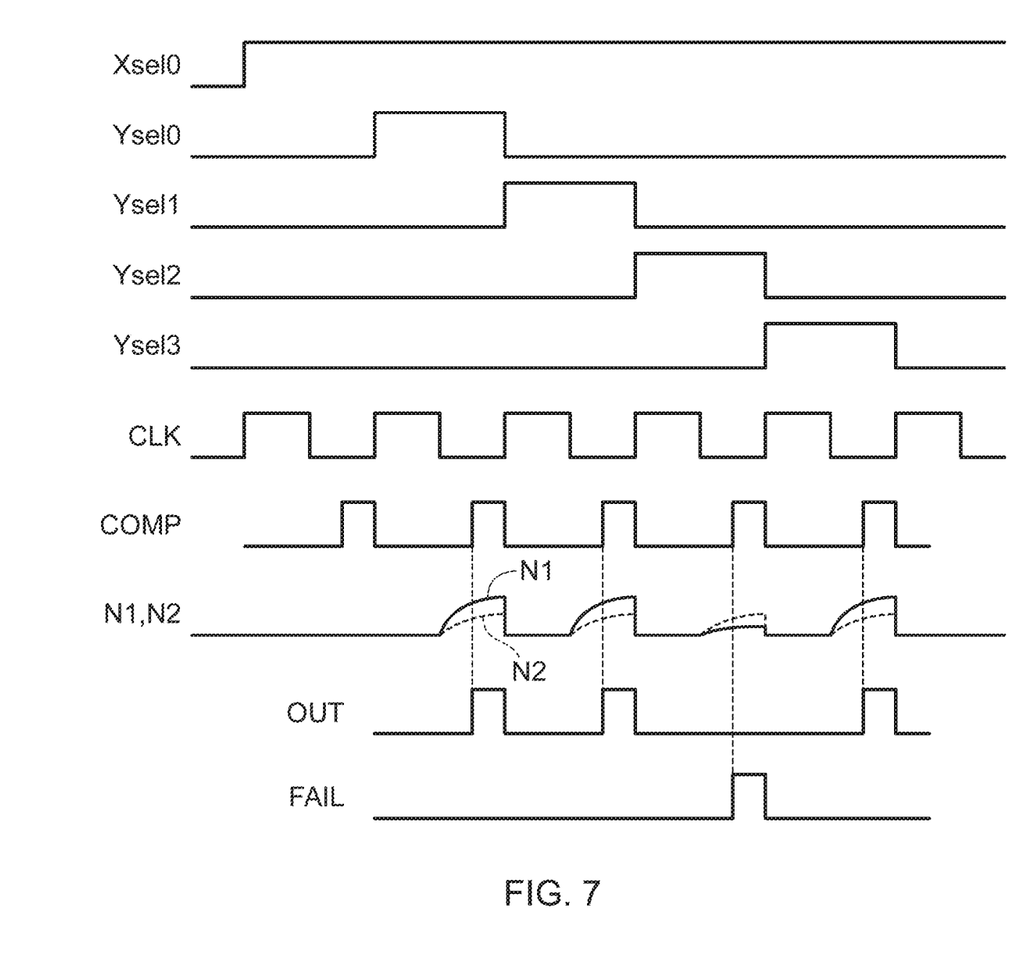

An operation of the circuit shown in FIG. 5 is described referring to FIGS. 6 and 7. FIG. 6 shows a waveform in a case where there is no failure in each signal path 32, and FIG. 7 shows a waveform in a case where there is a failure in a part of the signal paths 32. First, in a state where any of the selection signals Xsel0, Xsel1, Xsel2, Xsel3, . . . (the selection signal Xsel0 in the example shown in FIGS. 6 and 7) is activated to a high level, the selection signals Ysel0, Ysel1, Ysel2, Ysel3, . . . are activated to a high level sequentially. Therefore, the TSVs 30 arranged in a matrix form as shown in FIG. 2 are selected sequentially and, via the selected TSV 30, a corresponding one of the signals paths 32 is charged. It suffices that charging of the signal path 32 is performed in any one of the memory core chips 20 to 27, and charging in the other memory core chips is not required. It is preferable to perform charging of each signal path 32 in the memory core chip 27 in the uppermost layer. By charging each signal path 32 in the memory core chip 27 in the uppermost layer, all the TSVs 30 included in that signal path 32 can be tested. Meanwhile, by charging each signal path 32 in any one of the memory core chips 20 to 26 that are not in the uppermost layer, it is possible to specify which one of the memory core chips 20 to 26 includes a defective TSV 30 in a case where there is a failure in the signal path 32. In a case of charging each signal path 32 in the memory core chip 27 in the uppermost layer, it suffices to activate the selection signal SliceEn corresponding to the memory core chip 27 in the uppermost layer to a high level and to deactivate the selection signals SliceEn corresponding to the other memory core chips 20 to 26 to a low level. Also for the interface chip 10, the corresponding selection signal SliceEn is activated to a high level. The replica path 32R is also charged by activating the enable signals EnF for the memory core chip 27 in the uppermost layer and the interface chip 10.

As shown in FIGS. 6 and 7, one cycle of the test clock signal CLK is coincident with an activation period of the selection signals Ysel0, Ysel1, Ysel2, Ysel3, . . . . Therefore, during a first half of a period during which one of the signal paths 32 is selected, the transistor 47 is on, and therefore the selected signal path 32 and the replica path 32R are discharged and the nodes N1 and N2 are placed at a VSS level. Meanwhile, during a latter half of the period during which one of the signal paths 32 is selected, the transistor 47 is off, and therefore discharging of the selected signal path 32 and the replica path 32R stops. When discharging of the selected signal path 32 and the replica path 32R stops, the selected signal path 32 and the replica path 32R are charged via the transistors 41 and 48, respectively, so that the levels at the nodes N1 and N2 rise. At this time, a rate of rise of the level at the node N1 is determined by the resistance value and the parasitic capacitance C1 of the signal path 32. Further, a rate of rise of the level at the node N2 is determined by the resistance value and the parasitic capacitance C2 of the replica path 32R. Although the parasitic capacitance C2 of the replica path 32R is substantially the same as the parasitic capacitance C1 of the signal path 32 as described above, a charging rate of the replica path 32R is lower than that of the signal path 32 unless the signal path 32 has a failure, because the dummy resistor Rd is inserted in series to the replica path 32R. FIG. 6 shows a waveform in a case where each signal path 32 does not have a failure, and the level at the node N1 rises faster than the level at the node N2. The comparison signal COMP is activated at a timing after the test clock signal CLK is changed from a high level to a low level and before the test clock signal CLK is changed to a high level again. When the comparison signal COMP is activated, the comparator circuit 49 performs an operation of comparing the level at the node N1 and the level at the node N2 with each other, and places its output signal OUT at a high level when the level at the node N1 is higher. This means that the signal path 32 has no failure, and a fail signal FAIL is kept inactive.

Meanwhile, FIG. 7 shows a waveform in a case where the signal path 32 corresponding to the selection signals Xsel0 and Ysel2 has a failure. When there is a failure in the signal path 32, its resistance value is high and a charging rate of the signal path 32 is lowered. As a failure in the signal path 32, cases can be considered where the resistance of the TSV 30 itself becomes high and where the resistance of the signal path 32 becomes high because of a failure in a connecting portion via the TSV bump 31B. If the resistance value of the signal path 32 is higher than the resistance value of the replica path 32R, the level at the node N1 rises more slowly than the level at the node N2. In this case, when the comparison signal COMP is activated, the comparator circuit 49 places its output signal OUT at a low level. This means that the signal path 32 has a failure, and the fail signal FAIL is activated. When the fail signal FAIL is activated, the corresponding signal path 32 is disabled and is replaced with a spare signal path.

As a method of inspecting the signal paths 32, a method can also be considered in which the replica path 32R is not used as a reference, but a constant reference voltage is used. That is, a method is considered which connects one of input terminals of the comparator circuit 49 to the node N1 and the constant reference voltage is applied to the other input terminal of the comparator circuit 49. In this method, however, a result of determination of pass or fail may be changed by the frequency of the test clock signal CLK. For example, in a case where the actual frequency of the test clock signal CLK is higher than a designed value, a charging time of the signal path 32 is shorter than expected, and therefore the signal path 32 that is not defective may be determined as being defective. To the contrary, in a case where the actual frequency of the test clock signal CLK is lower than the designed value, the charging time of the signal path 32 is longer than expected, and therefore the signal path 32 that is defective is determined as being non-defective. Furthermore, an off-leak current from the output buffer 45 also flows into the signal path 32. Therefore, when the charging time of the signal path 32 becomes longer than expected, the risk of determining the defective signal path 32 as being not defective is increased, and even the signal path 32 that is completely disconnected may be determined as being non-defective. To the contrary, a semiconductor device according to the present embodiment uses the replica path 32R as a reference. Therefore, even if the actual frequency of the test clock signal CLK is different from that of a designed value, this difference affects the signal path 32 and the replica path 32R evenly. Further, the off-leak current from the output buffer 45 also affects the signal path 32 and the replica path 32R evenly. Accordingly, correct inspection can be performed for each signal path 32. Further, because correct inspection can be performed even if the frequency of the test clock signal CLK is designed to be higher, it is possible to complete inspection for a number of signal paths 32 with sufficient margin within an initialization period after a power is turned on, even in a case where the inspection is performed in the initialization period.

Figure 8:
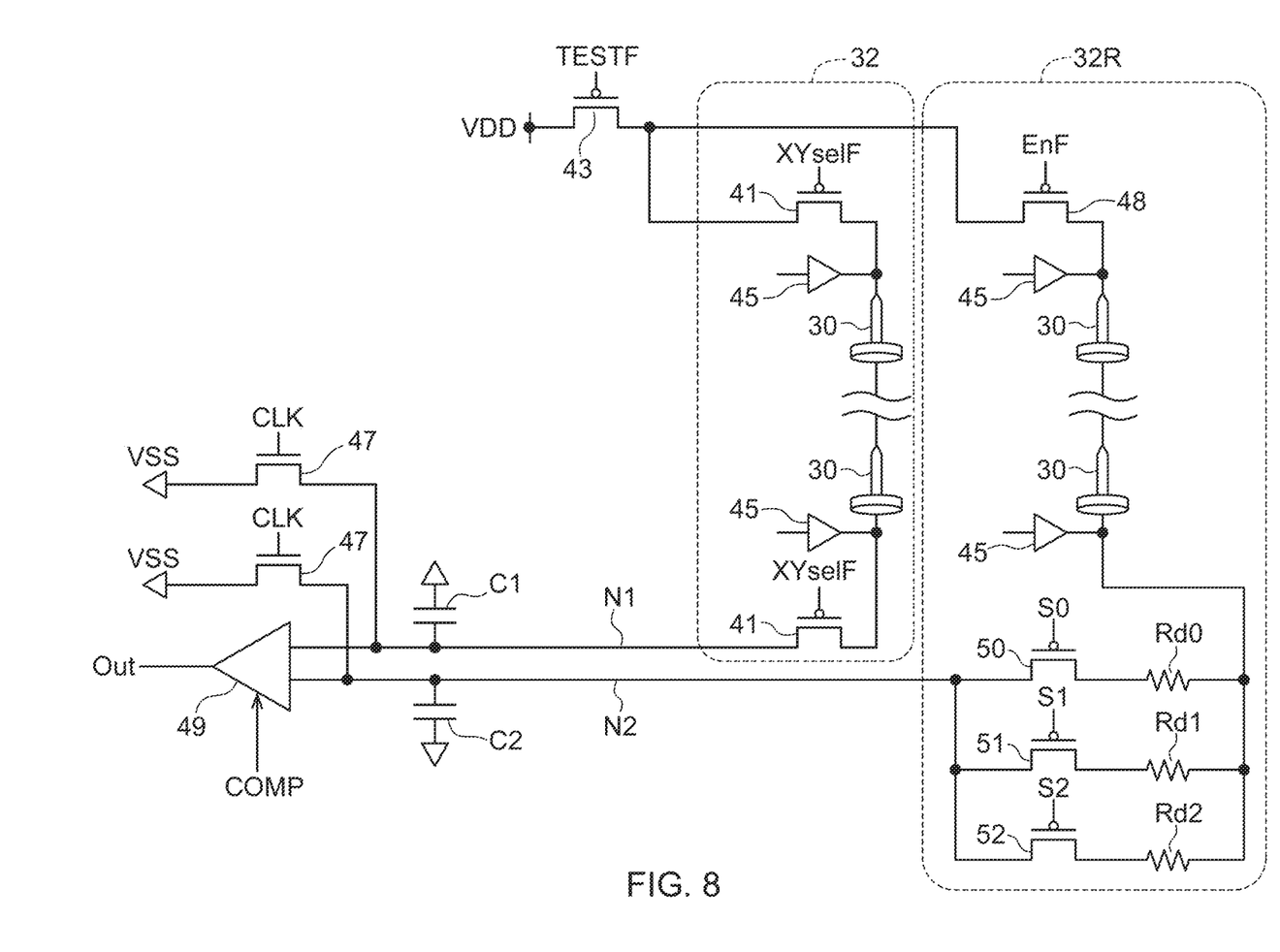
FIG. 8 is a circuit diagram showing a second circuit example in which a signal path is inspected.

Further, a plurality of dummy resistors Rd0 to Rd2 connected in parallel may be inserted into the replica path 32R, as shown in FIG. 8. By further inserting transistors 50 to 52 in series to the respective dummy resistors Rd0 to Rd2 and turning on one of the transistors 50 to 52 or two or more of them by using one, or two or more of selection signals S0 to S2, it is possible to change the resistance value of the replica path 32R. Therefore, it is possible to switch a resistance value in which the signal path 32 is determined as being defective by the selection signals S0 to S2. In this case, it is preferable that the resistance values of the dummy resistors Rd0 to Rd2 are different from one another.

Figure 9:
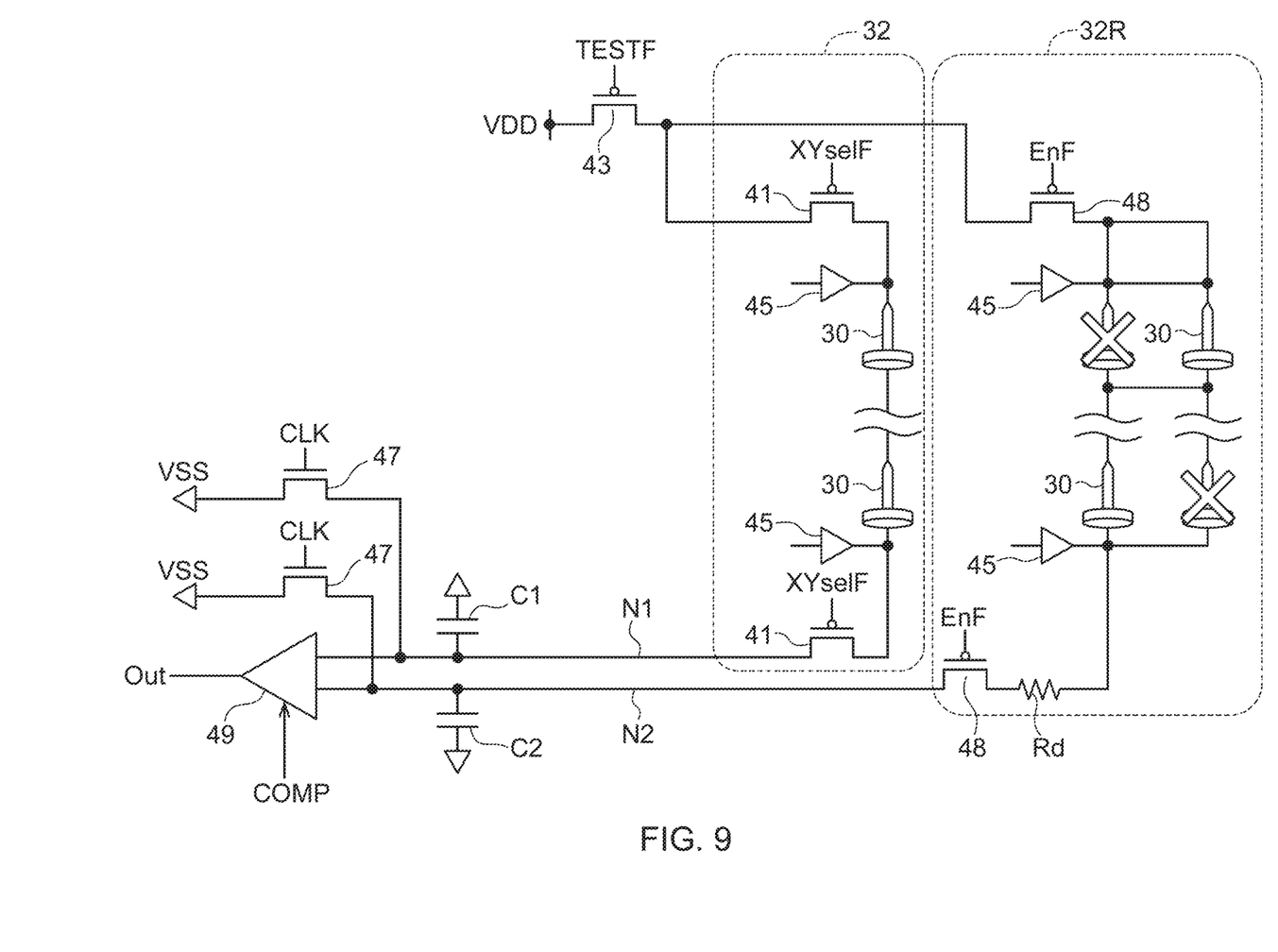
FIG. 9 is a circuit diagram showing a third circuit example in which a signal path is inspected.

Furthermore, as shown in FIG. 9, two TSVs 30 may be used to configure the replica path 32R in each of the memory core chips 20 to 26 and the interface chip 10, while the two TSVs 30 are connected in parallel. With this configuration, even in a case where there is a failure in a part of the TSVs 30 that configure the replica path 32R, inspection of the signal path 32 can be performed correctly. In this case, the resistance value of the replica path 32R is slightly lowered because of parallel connection of the two TSVs 30. However, the total resistance value of eight TSVs 30 included in the replica path 32R is about 1Ω and is sufficiently low as compared with an on-resistance of the transistor 48. Therefore, lowering of the resistance value of the replica path 32R has almost no influence on the inspection. Further, three or more of the TSVs 30 may be connected in parallel.

Figure 10:
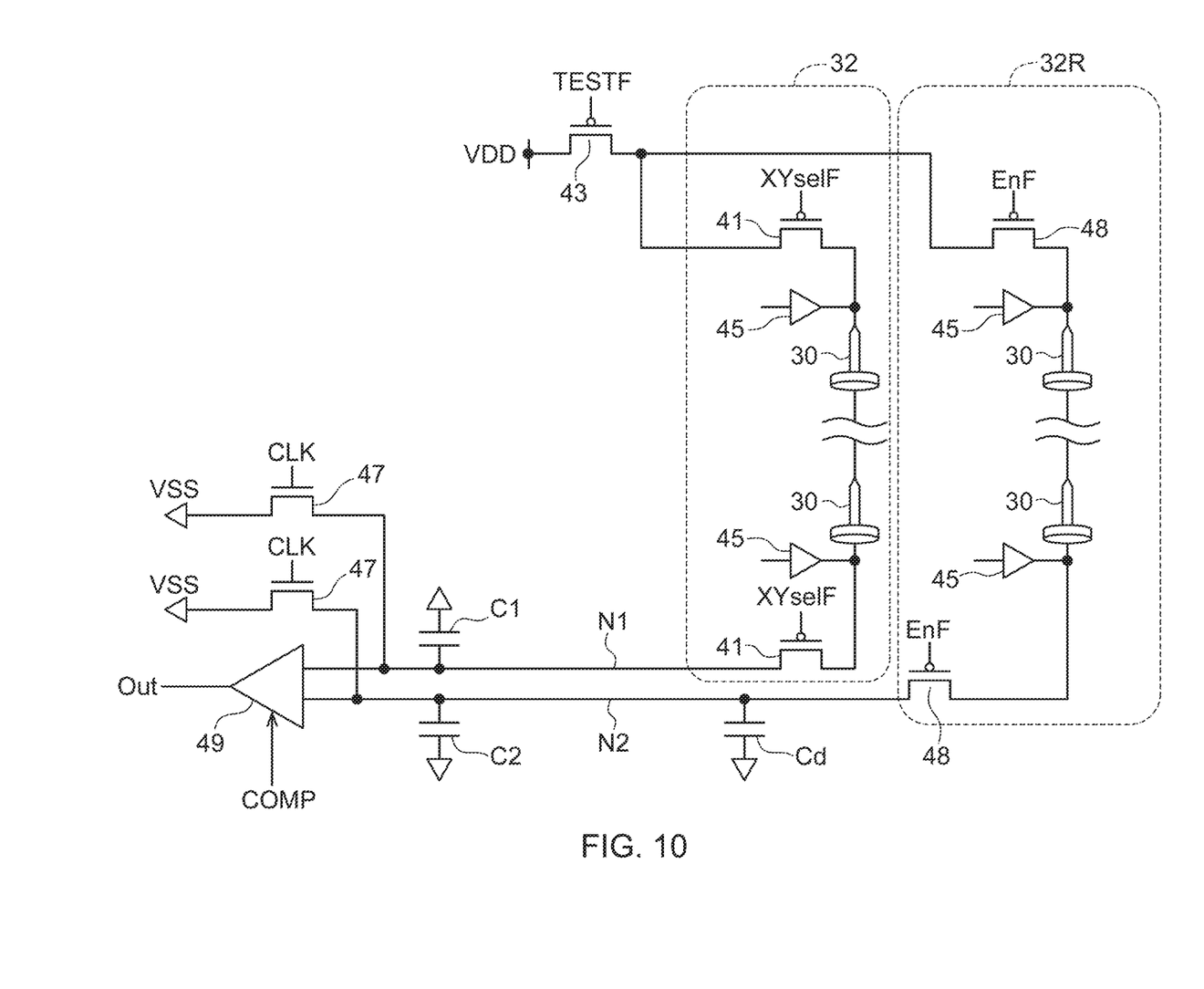
FIG. 10 is a circuit diagram showing a fourth circuit example in which a signal path is inspected.

Further, a dummy capacitance Cd may be connected to the replica path 32R instead of inserting the dummy resistor Rd into the replica path 32R, as shown in FIG. 10. Also in this case, an operation that is basically the same as that of the circuit shown in FIG. 5 can be performed because a time constant of the replica path 32R is larger than a time constant of the signal path 32.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:
1. An apparatus comprising:
a first semiconductor chip;
first and second TSVs penetrating the first semiconductor chip;
a first path including the first TSV;
a second path including the second TSV;
a first charge circuit configured to charge the first path;
a second charge circuit configured to charge the second path;
a first discharge circuit configured to discharge the first path;
a second discharge circuit configured to discharge the second path; and
a comparator circuit configured to compare a potential of the first path with a potential of the second path, wherein the first and second charge circuits are configured to charge the first and second paths simultaneously.

2. The apparatus as claimed in claim 1, wherein the first and second discharge circuits are configured to discharge the first and second paths simultaneously.

3. The apparatus as claimed in claim 1, further comprising a second semiconductor chip on which the first semiconductor chip is stacked,
wherein the first and second discharge circuits are formed on the second semiconductor chip.

4. The apparatus as claimed in claim 3,
wherein the first semiconductor chip is a memory core chip, and
wherein the second semiconductor chip is an interface chip.

5. The apparatus as claimed in claim 4, further comprising a third semiconductor chip stacked on the first and second semiconductor chips,
 wherein the first and second charge circuits are formed on the third semiconductor chip.

6. The apparatus as claimed in claim 5, wherein the third semiconductor chip is another memory core chip.

7. The apparatus as claimed in claim 1, wherein the second path includes a dummy resistor circuit connected in series to the second TSV.

8. The apparatus as claimed in claim 7, wherein the dummy resistor circuit includes a plurality of resistor elements connected in parallel.

9. The apparatus as claimed in claim 1, further comprising a third TSV penetrating the first semiconductor chip,
 wherein the second path includes the second and third TSVs connected in parallel.

10. An apparatus comprising
 a plurality of first semiconductor chips stacked on one another, the plurality of first semiconductor chips including a first path and a second path each passing through the plurality of first semiconductor chips; and
 an interface chip stacked on the plurality of first semiconductor chips such that the interface chip is coupled to each of first ends of the first path and the second path, the interface chip being configured to control:
 charging, simultaneously, each of second ends of the first path and the second path with a first voltage; and
 comparing potentials of the first ends of the first path and the second path after charging each of second ends of the first path and second path with the first voltage.

11. The apparatus of claim 10, wherein the interface chip is configured to control discharging each of the first ends of the first path and the second path.

12. The apparatus of claim 11, wherein the interface chip is configured to control discharging each of the first ends of the first path and the second path during a first period and control charging each of the second ends of the first path and the second path during a second period subsequent to the first period.

13. The apparatus of claim 12, wherein the interface chip is configured to control comparing potentials of the first ends of the first path and the second path during the second period.

14. The apparatus of claim 13, wherein the interface chip is configured to stop discharging each of the first ends of the first path and the second path during the second period.

15. The apparatus of claim 10, wherein the second path has higher in resistance or capacitance than the first path with no bad connection.

16. The apparatus of claim 15, wherein the second path has lower in resistance or capacitance than the first path with bad connection.

17. The apparatus of claim 10, further comprising a second semiconductor chip stacked on the plurality of first semiconductor chips such that the plurality of first semiconductor chips are sandwiched between the interface chip and the second semiconductor chip,
 wherein each of the second ends of the first path and the second path is located at the second semiconductor chip.

18. An apparatus comprising:
 a semiconductor chip;
 a plurality of first TSVs penetrating the semiconductor chip;
 a second TSV penetrating the semiconductor chip;
 a first circuit configured to select one of the plurality of first TSVs;
 a second circuit configured to simultaneously apply a first potential to the selected one of the first TSV and the second TSV in response to a first timing signal;
 a third circuit configured to apply a second potential different from the first potential to the selected one of the first TSV and the second TSV in response to a second timing signal; and
 a fourth circuit configured to compare a potential of the selected one of the first TSV and a potential of the second TSV.

19. The apparatus of claim 18,
 wherein the plurality of first TSVs are arranged in a matrix form, and
 wherein the first circuit includes:
 a plurality of row selection lines each of which is assigned in common to two or more of the first TSVs arranged in a row direction;
 a plurality of column selection lines each of which is assigned in common to two or more of the first TSVs arranged in a column direction;
 a row selection circuit configured to activate one of the row selection lines; and
 a column selection circuit configured to activate one of the column selection lines.

20. The apparatus of claim 18, wherein the second timing signal is configured to oscillate between a first state and a second state,
 wherein when the second timing signal is at the first state, the selected one of the first TSV and the second TSV are discharged, and
 wherein when the second timing signal is at the second state, the selected one of the first TSV and the second TSV are charged.

* * * * *